US009960062B2

(12) United States Patent
Peek

(10) Patent No.: US 9,960,062 B2
(45) Date of Patent: May 1, 2018

(54) EFFLUENT CONTROL SYSTEM

(71) Applicant: Haws Corporation, Sparks, NV (US)

(72) Inventor: Benjamin R. Peek, Beaverton, OR (US)

(73) Assignee: PEEK PROCESS INSIGHTS, INC., Beaverton, OR (US)

( * ) Notice: Subject to any disclaimer, the term of this patent is extended or adjusted under 35 U.S.C. 154(b) by 175 days.

(21) Appl. No.: 14/740,085

(22) Filed: Jun. 15, 2015

(65) Prior Publication Data
US 2016/0365263 A1 Dec. 15, 2016

(51) Int. Cl.
H01L 21/67 (2006.01)

(52) U.S. Cl.
CPC .. *H01L 21/67253* (2013.01); *H01L 21/67028* (2013.01)

(58) Field of Classification Search
CPC .............. H01L 21/67253; H01L 21/67028
USPC .......................................................... 73/23.2
See application file for complete search history.

(56) References Cited

U.S. PATENT DOCUMENTS

| 5,138,869 | A | 8/1992 | Tom | |
|---|---|---|---|---|
| 5,845,660 | A * | 12/1998 | Shindo | H01L 21/67028 134/102.3 |
| 6,322,756 | B1 | 11/2001 | Arno et al. | |
| 6,862,557 | B2 | 3/2005 | Jones et al. | |
| 2003/0147075 | A1 * | 8/2003 | Otsuki | C23C 16/4405 356/338 |
| 2004/0247787 | A1 | 12/2004 | Mackie et al. | |
| 2007/0158274 | A1 * | 7/2007 | King | C02F 1/76 210/739 |
| 2008/0102011 | A1 * | 5/2008 | Moalem | B01D 53/68 423/240 R |
| 2010/0000682 | A1 * | 1/2010 | Amano | H01L 21/67017 156/345.29 |
| 2011/0308560 | A1 | 12/2011 | Arbuckle et al. | |
| 2014/0200702 | A1 | 7/2014 | Liu et al. | |
| 2016/0365262 | A1 | 12/2016 | Peek | |

FOREIGN PATENT DOCUMENTS

WO WO 2016/205337 A1 12/2016
WO WO 2016/205360 A1 12/2016

OTHER PUBLICATIONS

PCT International Search Report and Written Opinion of the International Search Authority for application PCT/US2016/037584 dated Sep. 1, 2016.
PCT International Search Report and Written Opinion of the International Search Authority for application PCT/US2016/037612 dated Sep. 16, 2016.

(Continued)

*Primary Examiner* — John Fitzgerald
*Assistant Examiner* — Marrit Eyassu
(74) *Attorney, Agent, or Firm* — Alston & Bird LLP

(57) ABSTRACT

An apparatus, method, and system for collecting data related to effluent emitted from tools in semiconductor fabrication facilities using one or more sensors to take continuous real-time samples of the effluent to indicate one or more properties and characteristics of effluent, and based at least in part on the properties and characteristics indicated in the samples taken by at least one or more sensors, determining the proper processing, recyclability, and treatment of the effluent.

24 Claims, 7 Drawing Sheets

(56) References Cited

OTHER PUBLICATIONS

Donovan et al., "Design of Recycling System for Spent Rinse Water in Sandia's Microelectronics Development Laboratory," International Sematech, Inc. Report, Technology Transfer #98113599A-ENG, Nov. 30, 1998. [Retrieved from the Internet Apr. 27, 2017: <http://www.sematech.org/docubase/document/3599aeng.pdf>].
Donovan, "Reducing water usage in semiconductor manufacturing," Solid State Technology Insights for Electronics Manufacturing website blog, Jun. 2002. [Retrieved from the Internet Apr. 26, 2017: <http://electroiq.com/blog/2002/06/reducing-water-usage-in-semiconductor-manufacturing/>].
U.S. Appl. No. 14/740,077, Non-Final Office Action dated Dec. 29, 2017.
PCT International Preliminary Report for application PCT/US2016/037584 dated Dec. 19, 2017.
PCT International Preliminary Report for application PCT/US2016/037612 dated Dec. 19, 2017.

\* cited by examiner

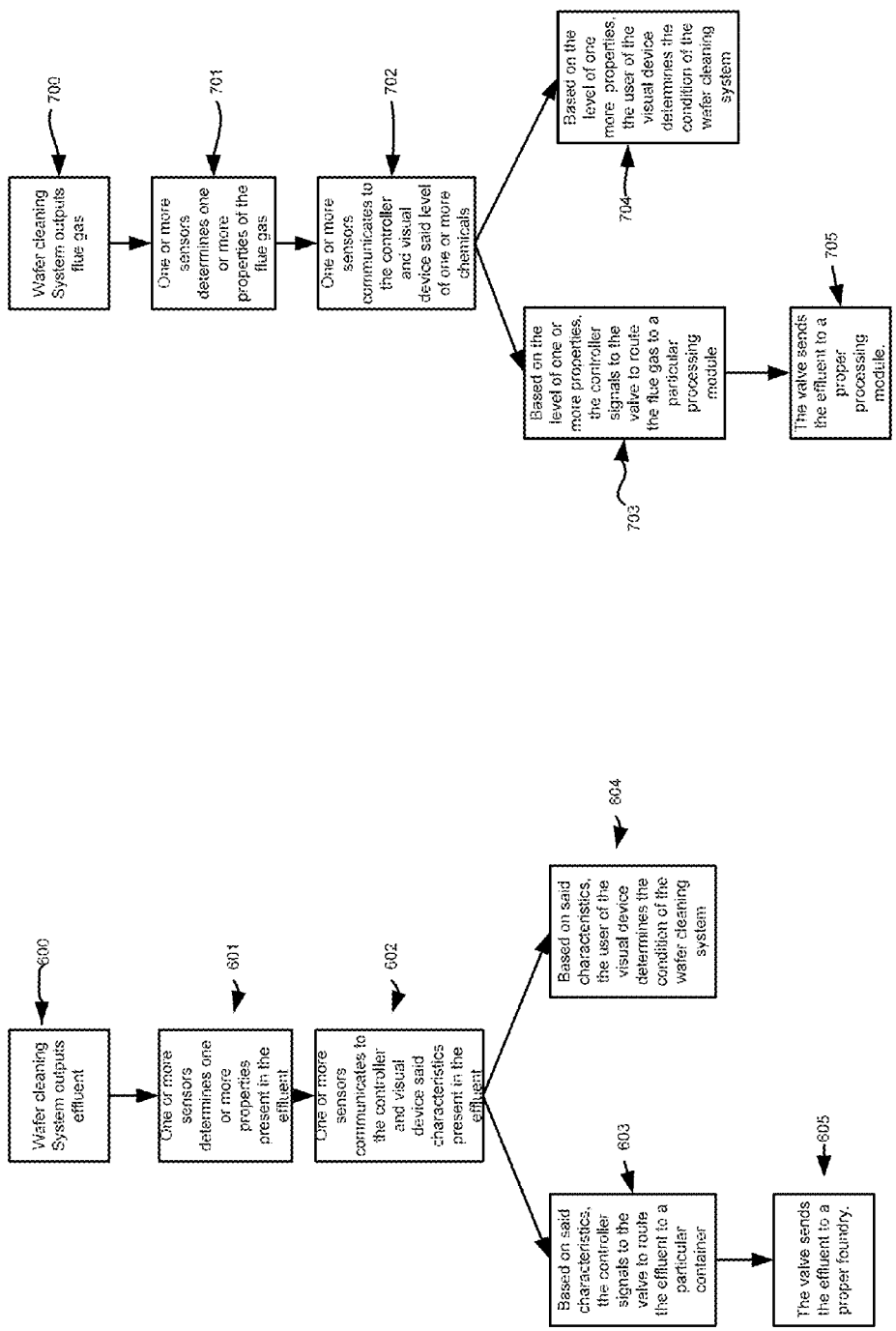

EFFLUENT CONTROL SYSTEM

BACKGROUND

Water is essential to semiconductor fabrication. It is estimated that creating an integrated circuit on a 300 mm wafer requires approximately 2,200 gallons of water in total, of which more than 68% (1,500 gallons) is ultra-pure water (UPW). With flow rates for a manufacturing fabrication facility ranging from 500 to 2,000 gallons-per-minute, a complete system can cost between $25-40 million. Water use of 3-4 million gallons per day for a 300 mm fabrication facility could double to 6-8 million gallons per day for future 450 mm fabrication facilities.

In order to save water in semiconductor fabrication facilities there needs to be new apparatuses and methods to control UPW and liquid effluent flows throughout the semiconductor fabrication facility.

SUMMARY

Described herein is a system for monitoring and recording flow data from UPW systems used for cleaning and rinsing of patterned wafers. A resource source monitoring system includes a liquid effluent monitoring system, a flue gas monitoring system, or both.

The invention described herein monitors liquid effluent to determine the potential recyclability of water. Based upon certain characteristics and properties of the liquid or gas effluent the resource monitoring system described herein will allow a custom valve to sort the liquid and gas effluent. For example, liquid effluent may be sorted into various categories: a high concentration (i.e. initially heavy with process chemicals and residue) to be treated; a lower concentration (i.e. less polluted) that can potentially be used for chilling towers, scrubbers, landscape, and related internal use (sometimes referred to as gray water); and a lowest concentration (i.e. cleaning wastewater that may be recycled into the front-end of the UPW system along with city water). By establishing a system to automatically control effluent recycling, the use of water can be optimized and potential errors in the tool responsible for wafer cleaning may be identified.

The invention described herein is also configured to process gas effluent based on certain characteristics and properties of the gas effluent. For example, gas effluent may be sorted into: a highly acidic concentration (e.g. with a strong presence of acids such as hydrofluoric and hydrochloric acids); a highly caustic concentration (e.g. with a strong presence of ammonia); a high concentration of carbon; and a high concentration of ozone. By establishing a system to automatically control effluent gas processing, potentially harmful gases can be properly treated before release into the atmosphere, potential errors in the tool responsible for wafer cleaning may be identified, and employee safety can be ensured.

The invention described herein will increase process tool efficiency and productivity, optimize water utilization, intelligently monitor and provide real time data to assist improved sustainability, and provide environmental health and safety (EHS) enhancements for code compliance and employee safety.

In some embodiments, a flue gas monitoring system comprises a flue outlet pipe connected to a flue outlet port of a wafer cleaning system for receiving a flue gas released by the wafer cleaning system; a flue bypass pipe connected to the flue outlet pipe and in fluid communication with a set of one or more flue sensors, the one or more flue sensors configured to generate one or more outputs indicative of concentrations in the flue gas of one or more of: hydrogen fluoride, hydrogen chloride, ammonia, isopropyl alcohol, carbon, ozone or any reagent that can result in a gaseous emission from the wafer cleaning system; first, second and third flue diversion pipes, the first flue diversion pipe connected at a downstream end to a first processing module, the second flue diversion pipe connected at a downstream end to an second processing module, the third flue diversion pipe connected at a downstream end to a third processing module; a valve connected to the flue outlet pipe and to the first, second and third flue diversion pipes, the valve positioned to be downstream from the flue outlet pipe and upstream of the first, second and third flue diversion pipes, the valve configured to direct the flue gas from the flue outlet pipe to one of the first, second or third flue diversion pipes; and a controller having as inputs one or more of: the one or more outputs from the one or more flue sensors, the operational stage of the wafer cleaning system, and the predetermined chemical mixture corresponding to a particular operational stage of the wafer cleaning system, the controller, based at least on the one or more inputs, having as an output a valve control instruction, the valve mechanism having as an input the valve control instruction, the valve directing the flue gas to the first, second or third flue diversion pipes based on the valve control instruction.

In some embodiments, an liquid monitoring system, comprises one or more outlet pipes connected to one or more outlet ports of a wafer cleaning system for receiving one or more liquid effluents discharged by the wafer cleaning system; one or more bypass pipes connected to the one or more outlet pipes, the one or more bypass pipes in fluid communication with a set of one or more sensors, the one or more sensors including a pH sensor and a resistivity sensor, the pH sensor configured to generate a pH output indicative of a pH of the one or more liquid effluents, the resistivity sensor configured to generate a resistivity output indicative of a resistivity of the one or more liquid effluents; first, second and third diversion pipes, the first diversion pipe connected at a downstream end to a first storage facility, the second diversion pipe connected at a downstream end to a second storage facility, the third diversion pipe connected at a downstream end to a third storage facility; one or more valves connected to the one or more outlet pipes and to the first, second and third diversion pipes, the one or more valves positioned to be downstream from the one or more outlet pipes and upstream of the first, second and third diversion pipes, the one or more valve configured to direct the one or more liquid effluents from the one or more outlet pipes to one of the first, second or third diversion pipes; and a controller having as inputs at least the output or one or more sensors, the controller having as an output a valve control instruction, the controller generating the valve control instruction based on the output of the one or more sensors, the one or more valves having as an input the valve control instruction, the one or more valves directing the one or more liquid effluents to the first, second or third diversion pipes based on the valve control instruction.

BRIEF DESCRIPTION OF THE DRAWINGS

FIG. 6 demonstrates an example of a method of using the liquid effluent monitoring system of the resource monitoring system.

FIG. 7 demonstrates an example of a method of using the using the flue gas monitoring system of the resource monitoring system.

Figure 1:
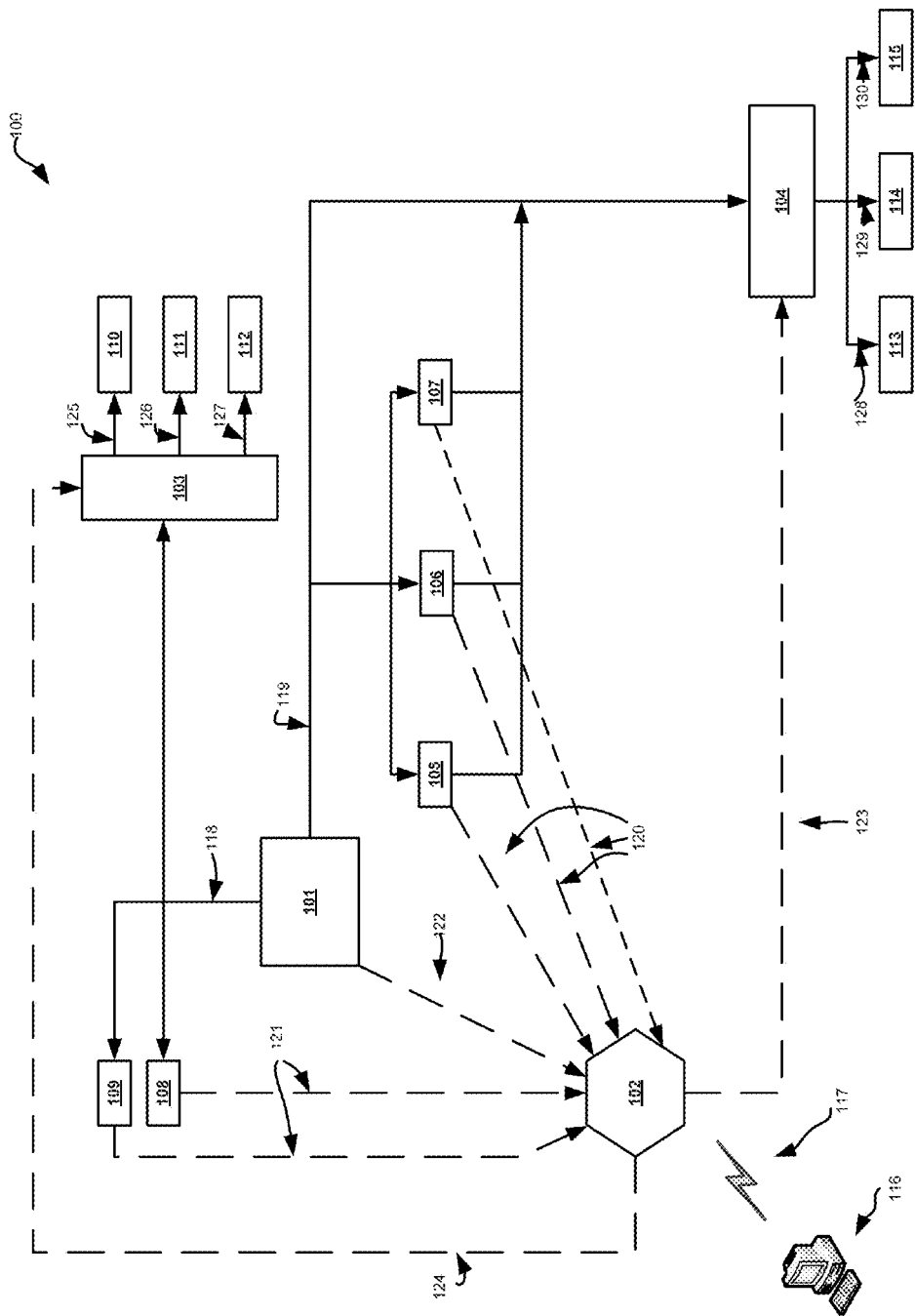
FIG. 1 shows a schematic diagram of an exemplary resource monitoring system

The accompanying drawings are not intended to be drawn to scale.

DETAILED DESCRIPTION

I. Definitions of Terms

Certain terms used in connection with exemplary embodiments are defined below.

As used herein, the term "wafer cleaning system," "tool(s)," and similar terms may be used interchangeably to refer to a wafer cleaning system, a chemical-mechanical planarization tool, any other tool or piece of equipment used in a semiconductor fabrication facility.

As used herein, the term "effluent" and similar terms are defined as a liquid, solid, or gaseous emission, such as the discharge or outflow from a machine or an industrial process.

As used herein, the term "monitoring" and similar terms are defined as a device or arrangement for observing, detecting, or recording the operation of a machine or system.

As used herein, the term "analysis" and similar terms are defined as the process of optimization of waste recovery by looking at tool and/or wafer cleaning system performance.

As used herein the term "flue gas" and similar terms are defined as a gaseous emission, such as the discharge outflow from a machine or an industrial process.

As used herein the terms "properties," "characteristics," and similar terms may be used interchangeably to refer to features, qualities, attributes, properties, components, nature, characteristics, and the like belonging to a corresponding object.

As used herein the term "storage facility," "foundry," and similar terms are defined as a tank, a reservoir, or any other instrument that is capable of holding effluent.

As used herein, the terms "data," "content," "information," and similar terms may be used interchangeably to refer to data capable of being transmitted, received, and/or stored in accordance with embodiments of the present invention. Thus, use of any such terms should not be taken to limit the spirit and scope of embodiments of the present invention. Further, where a module, processor or device is described herein to receive data from another module, processor or device, it will be appreciated that the data may be received directly from the another module, processor or device or may be received indirectly via one or more intermediary modules or devices, such as, for example, one or more servers, relays, routers, network access points, base stations, hosts, and/or the like, sometimes referred to herein as a "network." Similarly, where a computing device is described herein to send data to another computing device, it will be appreciated that the data may be sent directly to the another computing device or may be sent indirectly via one or more intermediary computing devices, such as, for example, one or more servers, relays, routers, network access points, base stations, hosts, and/or the like.

As used herein, the term "module," encompasses hardware, software and/or firmware configured to perform one or more particular functions.

As used herein, the term "computer-readable medium" refers to a non-transitory storage hardware, non-transitory storage device or non-transitory computer system memory that may be accessed by a controller, a microcontroller, a computational system or a module of a computational system to encode thereon computer-executable instructions or software programs. A "non-transitory computer-readable medium" may be accessed by a computational system or a module of a computational system to retrieve and/or execute the computer-executable instructions or software programs encoded on the medium. A non-transitory computer-readable medium may include, but is not limited to, one or more types of non-transitory hardware memory, non-transitory tangible media (for example, one or more magnetic storage disks, one or more optical disks, one or more USB flash drives), computer system memory or random access memory (such as, DRAM, SRAM, EDO RAM), and the like.

As used herein, the term "set" refers to a collection of one or more items.

As used herein, the term "plurality" refers to two or more items.

As used herein, the terms "equal" and "substantially equal" refer interchangeably, in a broad lay sense, to exact equality or approximate equality within some tolerance.

As used herein, the terms "similar" and "substantially similar" refer interchangeably, in a broad lay sense, to exact sameness or approximate similarity within some tolerance.

As used herein, the terms "couple" and "connect" encompass direct or indirect connection among two or more components. For example, a first component may be coupled to a second component directly or through one or more intermediate components.

Some exemplary embodiments of the present invention will now be described more fully hereinafter with reference to the accompanying drawings in which some, but not all, embodiments of the inventions are shown. Indeed, these inventions may be embodied in many different forms and should not be construed as limited to the embodiments set forth herein. Like numbers refer to like elements throughout.

II. Exemplary Embodiments

FIG. 1 shows a schematic diagram of an exemplary resource monitoring system. Resource monitoring system 100 may detect, monitor, store, and utilize information gathered from a wafer cleaning system's 101 liquid effluent or flue gas omission. Wafer cleaning system 101 can be any system or tool that removes particles and or chemical impurities from a semiconductor surface including but not limited to: a Radio Corporation of America (RCA) cleaning system, a pre-diffusion cleaning system, a particle removal cleaning system, a metallic ion removal system, a single wafer cleaning system, a batch wafer cleaning system, and the like. Furthermore, Wafer cleaning system 101 may be implemented with any element or tool associated with a semiconductor fabrication facility.

Resource monitoring system 100 may include both a liquid effluent monitoring system (FIG. 1 items 102, 105, 106, 107, 104, 113, 114, 115 and related items) and a gas flue monitoring system (FIG. 1 items 102, 108, 109, 103, 110, 111, 112 and related items). In another embodiment, resource monitoring system 100 may include only a liquid effluent monitoring system. In another embodiment, resource monitoring system may include only a flue gas monitoring system. In some embodiments, resource monitoring system 10 may include a leak detector that detects when there is a leak in the resource monitoring system 100. In other embodiments, resource monitoring system 100 may include micro switches (door interlocks) that indicate if there is unauthorized access to the resource monitoring system 100. The leak detector and micro switches help assure that there is not any unintended exposure to potentially dangerous liquids or gases.

As a byproduct of operation, wafer cleaning system 101 may emit flue gas. Flue gas is routed via path 118 to sensors 108, 109 to determine if the flue gas contains one or more chemical components, characteristics, or properties that may make it necessary to process before the flue gas may be safely released in the atmosphere.

Sensors 108, 109 may detect in real-time the presence of: hydrogen fluoride, hydrogen chloride, ammonia, ethanol, isopropyl alcohol, carbon, ozone, any reagent that can result in a gaseous emission from wafer cleaning system 101, and the like. Sensors 108, 109 may also detect non-chemical characteristics of the flue gas including but not limited to: temperature and pressure. Sensors 108, 109 may detect characteristics of the flue gas at predetermined time intervals or continually such that monitoring of the flue gas can occur in real-time (i.e. without any intended delay). Sensors 108, 109 may detect characteristics of flue gas by taking a sample of the flue gas at least once every 1 to 999 milliseconds. In a preferred embodiment, sensors 108, 109 take a sample of the flue gas every 250 milliseconds. Furthermore, although only two sensors are illustrated there may be an infinite number of sensors, wherein each sensor is configured to detect a different characteristic of the flue gas.

Sensors 108, 109 may in real-time output the results of each sample to controller 102 using communication link 121 and any suitable communication protocol such as Ethernet. Sensors 108, 109 may also output in real-time the results of each sample to visual display device 116 for display and/or storage.

Controller 102 may be implemented using any standard computer equipment including but not limited to: a computer, a field programmable gate array, application specific integrated circuit, and the like. Controller 102 may also receive information from wafer cleaning system 101 using communication link 122 and any suitable communication protocol such as Ethernet. Information from wafer cleaning system 101 may include but not limited to: recipe information. In a wafer cleaning system, a recipe indicates steps and the chemicals used in each step for cleaning and rinsing a wafer. For example, in an RCA standard clean the first step is a procedure for removing organic residue from silicon wafers that includes using a mixture of water, ammonium hydroxide, and hydrogen peroxide. On the other hand, step two of the RCA standard clean is a procedure for removing metal ions from a wafer that includes using a mixture of water, hydrogen chloride, and hydrogen peroxide. In some embodiments, visual display device 116 may also receive recipe information from wafer cleaning system 101 for display and/or storage.

Based on information from sensors 108, 109 and/or wafer cleaning system 101, controller 102 is able to send a signal via communication link 124 using any suitable communication protocol (e.g. Ethernet) to valve 103. In response, valve 103 is able to direct flue gas to a particular one of the processing modules 110, 111, 112, using one of the corresponding diversion pipes 125, 126, 127. Processing modules 110, 111, 112 may provide different processes for treating the flue gas based on the characteristics of the flue gas. For example, processing module 110 may provide treatment for excessive causticity in the flue caused by a high presence of ammonia. In a second example, processing module 111 may provide treatment for excessive acidity in the flue gas caused by a high presence of hydrogen fluoride. In a third example, processing module 112 may provide treatment for excessive ozone in the flue gas. These three examples are not meant to limit the capabilities of the processing modules 110, 111, 112. The processing modules 110, 111, 112 may process flue gas in any particular way in accordance with the detected characteristics of the flue gas. Furthermore, although only three processing modules 110, 111, 112 are illustrated there may be an infinite number of processing modules.

Figure 5:
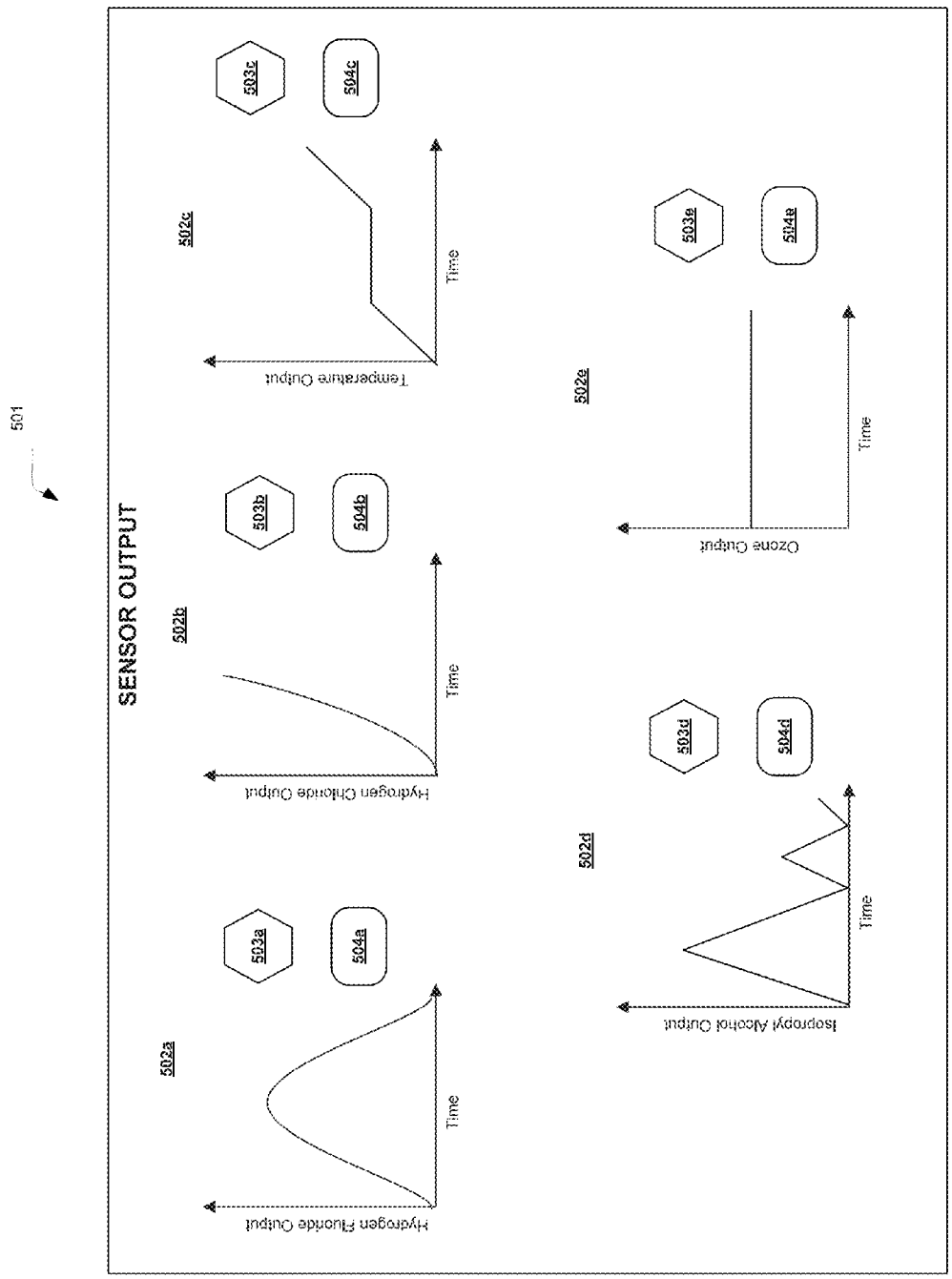
FIG. 5 shows an exemplary embodiment of the user interface of a visual display device.

In some embodiments, visual display device 116 receives, via communication link 117 by any suitable communication protocol (e.g. Ethernet), communications sent from controller 102 to valve 103. Visual display device 116 may display communications received from controller 102, sensors 108, 109, and wafer cleaning system 101 as shown in FIG. 5. In some embodiments visual display device 116 is general purpose computer with a monitor. In other embodiments, visual display device 116 is a handheld computer, PDA, cell phone, tablet, laptop computer, mobile computing device or the like.

As a byproduct of operation, wafer cleaning system 101 may emit liquid effluent. Liquid effluent via path 119 is routed to sensors 105, 106, 107 and valve 104. Sensors 105, 106, 107 determine if the effluent liquid 119 contains one or more chemical components, characteristics, or properties.

Sensors 105, 106, 107 may detect in real-time the presence of: hydrogen fluoride, hydrogen chloride, ammonia, water, isopropyl alcohol, carbon, ozone, hydrofluoric acid, and any reagent that can result in a liquid emission from wafer cleaning system 101, and the like. Sensors 105, 106, 107 may also detect and measure other characteristics of the liquid effluent including but not limited to: pH level, resistivity, temperature, and liquid flow. Sensors 105, 106, 107 may detect characteristics of the liquid effluent at predetermined time intervals or continually such that monitoring of the liquid effluent can occur in real-time (i.e. without any intended delay). Sensors 105, 106, 107 may detect characteristics of liquid effluent by taking a sample of the liquid effluent at least once every 1 to 999 milliseconds. In a preferred embodiment, sensors 105, 106, 107 take a sample of the liquid effluent every 250 milliseconds. Although only three sensors are illustrated there may be an infinite number of sensors present, wherein each sensor is configured to detect a different characteristic of the liquid effluent.

Sensors 105, 106, 107 may output the results of each sample taken of the liquid effluent to controller 102 in real-time using communication link 120 with any suitable communication protocol such as Ethernet. Sensors 105, 106, 107 may also output the results of each sample in real-time to visual display device 116 for display and/or storage.

Based on information output from sensors 105, 106, 107 and/or wafer cleaning system 101, controller 102 may send a signal via communication link 123 using any suitable communication protocol (e.g. Ethernet) to valve 104 to direct the liquid effluent to a particular one of the storage facilities 113, 114, 115 using one of the corresponding diversion pipes 128, 129, 130. Storage facilities 113, 114, 115 may provide different collection modules for the liquid effluent. For example, storage facility 113 may collect liquid effluent that has a pH value of 1 to 3. In a second example, storage facility 114 may collect liquid effluent that has a pH value of 3 to 5.5. In a third example, storage facility 115 may collect liquid effluent that has a pH value of 7 to 9. Although only storage facilities 113, 114, 115 are illustrated there may be an infinite number of storage facilities.

In some embodiments, visual display device 116 receives, via communication link 117 using any suitable communication protocol (e.g. Ethernet), communications sent from controller 102 to valve 103. Visual display device 116 may display communications received from controller 102, sensors 105, 106, 107 and wafer cleaning system 101 as illustrated in FIG. 5.

In some cases, resource monitoring system 100 may be configured to be connected to an existing wafer cleaning system 101 without the need to modify or retrofit the wafer cleaning system. In other cases, the resource monitoring system 100 may be configured to be integrated with the wafer cleaning system 103

The flue gas monitoring system and the liquid effluent monitoring system may operate independently in some cases, for example, using two different and independent controllers. In other cases, the flue gas monitoring system and the liquid effluent monitoring system may operate in cooperation with each other, for example, using the same controller.

Figure 2:
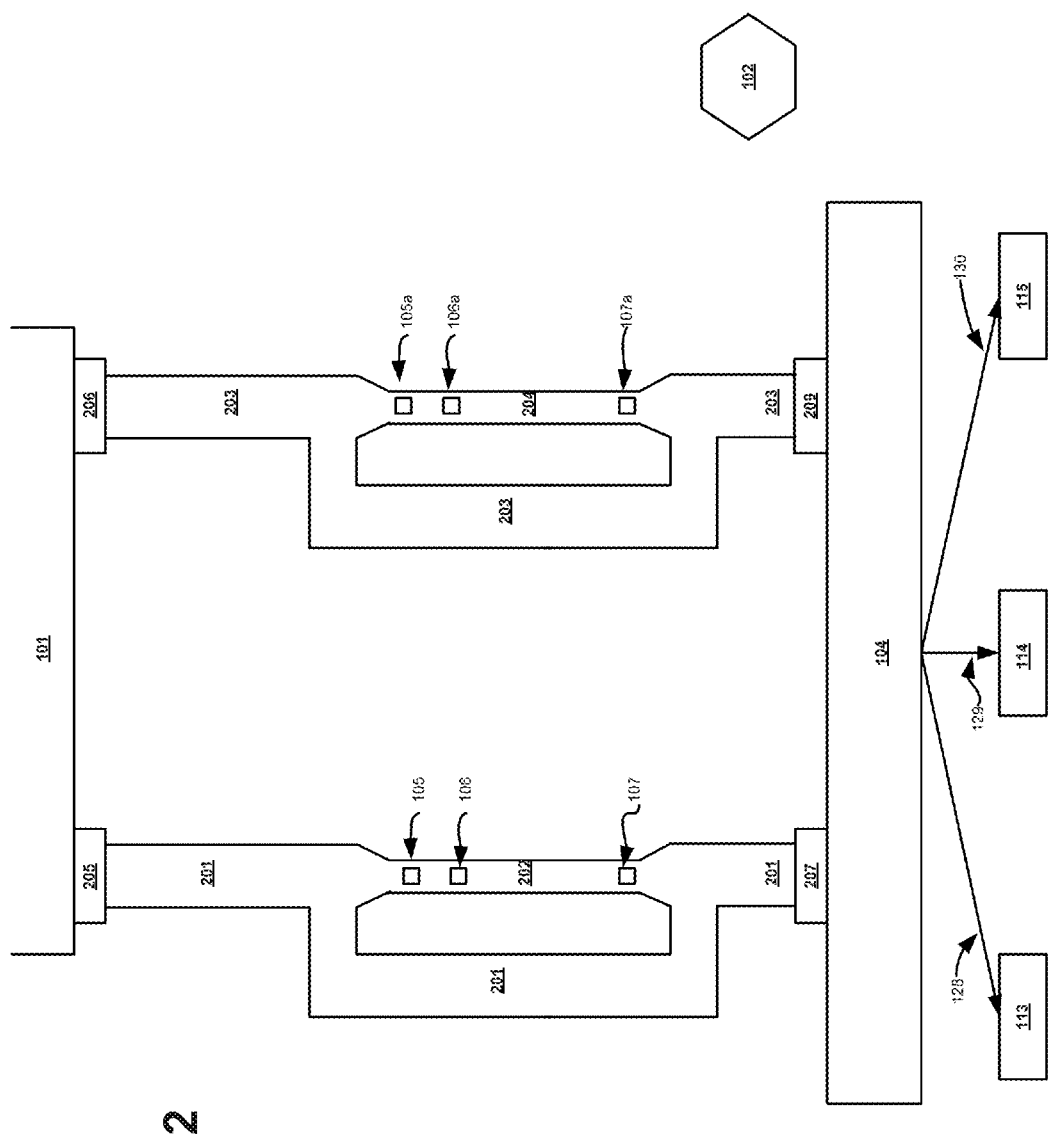
FIG. 2 shows an exemplary embodiment of a liquid effluent monitoring system of the exemplary resource monitoring system

FIG. 2 illustrates a more detailed view of an exemplary embodiment of a liquid effluent monitoring system of the exemplary resource monitoring system 100. Wafer cleaning system 101 may contain acid outlet port 205, for outputting acid liquid effluent from wafer cleaning system 101, and hydrofluoric acid outlet port 206, for outputting hydrofluoric acid liquid effluent from wafer cleaning system 101. The current operational stage of wafer cleaning system 101 will determine if the liquid effluent is flushed to acid drain 205 or hydrofluoric acid drain 206. However, it should be recognized that even if liquid effluent is output through acid drain 205, it does not necessarily mean the effluent will be acidic. Likewise, even if liquid effluent is output through hydrofluoric acid drain 206, it does not necessarily mean the effluent will be hydrofluoric acid. This anomaly is true because wafer cleaning systems do not detect the effluent to confirm its characteristics before it is drained, so is possible, for example, that hydrofluoric acid effluent could be unintentionally flushed to acid drain 205 instead of hydrofluoric acid drain 206.

Liquid effluent drained through acid drain 205 may be input into acid outlet pipe 201. Acid outlet pipe 201 feeds into acid bypass pipe 202 and acid valve input 207. Acid outlet pipe 201 may be dimensioned and configured to accommodate a volume flow rate of the liquid effluent released. In some embodiments, the liquid effluent in the acid outlet pipe 201 may have a volume flow rate between 2-200 gallons per minute. The volume flow rate may also be expressed in liters or other liquid volume measurements.

Acid outlet pipe 201 may include acid bypass pipe 202 that receives a portion of the liquid effluent flow from the acid outlet pipe 201 so that one or more properties of the liquid effluent may be detected by sensors 105, 106, 107, and returns the liquid effluent back to the acid outlet pipe 201. The acid bypass pipe 202 may have an upstream end connected to an upstream portion of the acid outlet pipe 201, and a downstream end that is in fluid communication with sensors 105, 106, 107.

The acid bypass pipe 202 may be dimensioned and configured so that the cross-sectional diameter is substantially smaller than cross-sectional diameter of the acid outlet pipe 201 to accommodate a smaller volume flow rate of the liquid effluent than is present in the acid outlet pipe 201. This enables the pressure of the liquid effluent in the acid bypass pipe 202 to be significantly lower than the pressure of the liquid effluent in the acid outlet pipe 201, which allows the sensors 105, 106, 107 to detect one or more properties of the liquid effluent without being damaged.

Further downstream from sensors 105, 106, 107 and the acid bypass pipe 202, the acid outlet pipe 201 may have a downstream end connected to valve input 207. Valve input 207 is connected to valve 104, and valve 104 routes the liquid effluent to storage facilities 113, 114, 115 using one of the corresponding diversion pipes 128, 129, 130. Valve 104 may include a single valve or a bank of multiple valves configured to selectively direct the liquid effluent in the acid outlet pipe 201 into one of the storage facilities 113, 114, 115 using one of the corresponding diversion pipes 128, 129, 130.

In one embodiment valve 104 may be operated by controller 102. Controller 102 may be configured to analyze the outputs from sensors 105, 106, 107 and based at least in part on the analysis, signal valve 104 to selectively divert the liquid effluent in the acid outlet pipe 201 to one of the storage facilities 113, 114, 115 using one of the corresponding diversion pipes 128, 129, 130.

Figure 8:
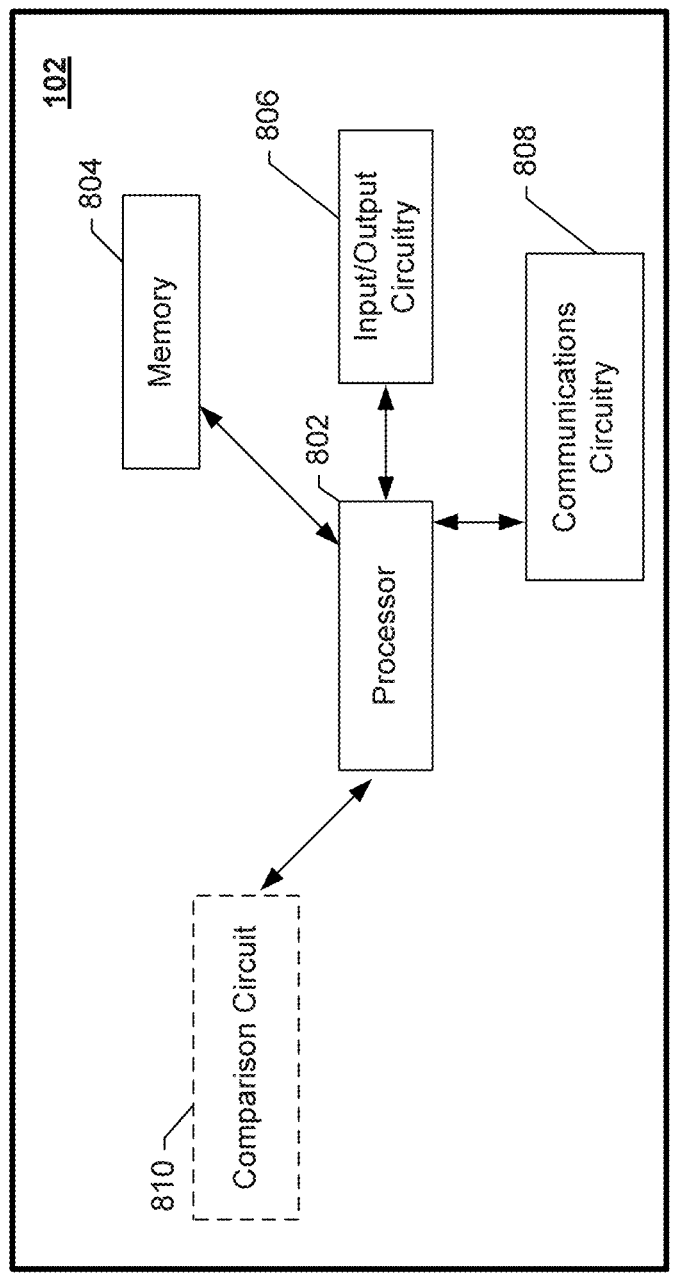
FIG. 8 shows an exemplary embodiment of a controller of the resource monitoring system.

Now with brief reference to FIG. 8, the controller 102 may include a comparison circuit 810, that receives as input one or more outputs from sensors 105, 106, 107 and compares the input to one or more predetermined threshold values, and generates a valve control instruction based on the comparison. In one embodiment, the valve control instruction may be an electronic single, instruction or unit of data communication configured to be received and interpreted by valve 104 and includes an indication of how valve 104 should direct the liquid effluent received from the acid outlet pipe 201 to one of the storage facilities 113, 114, 115, using one of the corresponding diversion pipes 128, 129, 130. For example, if sensor 105 outputs several indications of hydrofluoric acid in acid outlet pipe 201, then controller 102 may transmit instructions to valve 104 to open a port corresponding to storage facility 113, and ports corresponding to any other storage facility should remain closed.

In another embodiment, the comparison circuit 810 may compare one or more of the following sensor outputs to one or more corresponding predetermined threshold values: the pH output and the resistivity output. Controller 102 may compare output from sensors 105, 106, 107 to corresponding threshold values at predetermined time intervals or continually such that monitoring and control of the liquid effluent occur in real-time (i.e. without any intended delay).

In some embodiments, controller 102 may be provided in the wafer cleaning system 101. In other embodiments, controller 102 may be provided remotely or separately from the wafer cleaning system 101 but may receive data and/or instructions from the wafer cleaning system 101, for example, information on a current or past operational or cleaning state of the wafer cleaning system 101. In one embodiment, the controller 102 may generate a valve control instruction based on an input from the wafer cleaning system 101 including a current or past operational stage of the wafer cleaning system 101.

Returning to FIG. 2, in one example, if the comparisons performed on one or more of the inputs from sensors 105, 106, 107 indicate that the liquid effluent in the acid outlet pipe 201 is in the predetermined pH range of 1-2 (i.e. extremely acidic), then the valve control instruction may indicate that the valve 104 should selectively open only the output port connect to diversion pipe 128 and corresponding storage facility 113.

Similarly, if comparisons performed on one or more inputs from sensors 105, 106, 107 indicate that the liquid effluent in the acid outlet pipe 201 is in the predetermined pH range of 2.1 to 5 (moderately acidic), then the valve control instruction may indicate that valve 104 should selectively open only the output port connected to diversion pipe 128 and corresponding storage facility 114.

Similarly, if the comparisons performed on one more of the inputs from sensors 105, 106, 107 indicate that the liquid effluent in the acid outlet pipe 201 is in the predetermined pH range of 5.5-7 (minimally acidic), then the valve control instruction may indicate that valve 104 should selectively open only the output port connected to diversion pipe 130 and corresponding storage facility 115.

Separating the liquid effluent in acid outlet pipe 201, based at least in its pH value allows certain effluent to be reused with minimal processing. For example, effluent with a pH range of 5.5-7 might be useful as gray water that can be used in cooling towers. In another example, effluent with a pH of 7 might be useful for watering vegetation. In another embodiment, effluent with a pH value of 1-2 might be reusable as hydrofluoric acid.

Controller 102 may generate a valve control instruction based at least in part on: recipe information of wafer cleaning system 101, which indicates the operational state and combination of chemicals used in that operational state; output from sensors 105, 106, 107, which may indicate the flow rate of the liquid effluent, pH levels, resistivity, the presence of: hydrogen fluoride, hydrogen chloride, ammonia, water, isopropyl alcohol, carbon, ozone, and any reagent that can result in a liquid emission from wafer cleaning system 101; predetermined thresholds of any above listed measurable characteristics; or a combination of any two or more items listed above.

With continued reference to FIG. 2, liquid effluent may be output from wafer cleaning system 101 via hydrofluoric acid outlet port 206 and input into hydrofluoric acid outlet pipe 203. Hydrofluoric acid outlet pipe 203 feeds into hydrofluoric acid bypass pipe 204 and then eventually to valve input 208. Hydrofluoric acid outlet pipe 203 may be dimensioned and configured to accommodate a volume flow rate of the liquid effluent released. In some embodiments, the liquid effluent in the hydrofluoric outlet pipe 203 may have a volume flow rate between 2-200 gallons per minute. The volume flow rate may also be expressed in liters or other liquid volume measurements.

Hydrofluoric acid outlet pipe 203 may include hydrofluoric acid bypass pipe 204 that receives a portion of the liquid effluent flow from the hydrofluoric acid outlet pipe 203 so that one or more properties of the liquid effluent may be detected by sensors 105a, 106a, 107a, and returns the liquid effluent back to the hydrofluoric acid outlet pipe 203. The hydrofluoric acid bypass pipe 202 may have an upstream end connected to an upstream portion of the hydrofluoric acid outlet pipe 203, and a downstream end that is in fluid communication with sensors 105a, 106a, 107a.

The hydrofluoric acid bypass pipe 204 may be dimensioned and configured so that the cross-sectional diameter is substantially smaller than the cross-sectional diameter of the hydrofluoric acid outlet pipe 203 to accommodate a smaller volume flow rate of the liquid effluent than is present in the hydrofluoric acid outlet pipe 203. This enables the pressure of the liquid effluent in the hydrofluoric acid bypass pipe 204 to be significantly lower than the pressure of the liquid effluent in the hydrofluoric acid outlet pipe 203, which allows the sensor 105a, 106a, 107a to detect one or more properties of the liquid effluent without being damaged.

Further downstream from sensors 105a, 106a, 107a and the hydrofluoric acid bypass pipe 204, the hydrofluoric acid outlet pipe 203 may have a downstream end connected to valve input 209. Valve input 209 is connected to valve 104, and valve 104 routes the liquid effluent to storage facilities 113, 114, 115, using one of the corresponding diversion pipes 128, 129, 130. Valve 104 may include a single valve or a bank of multiple valves configured to selectively direct the liquid effluent in the hydrofluoric acid outlet pipe 203 into one of the storage facilities 113, 114, 115, using one of the corresponding diversion pipes 128, 129, 130.

In one embodiment valve 104 may be operated by controller 102. Controller 102 may be configured to analyze the outputs from sensors 105a, 106a, 107a and based at least in part on the analysis, signal valve 104 to selectively divert the liquid effluent in the hydrofluoric acid outlet pipe 203 to one or more of the storage facilities 113, 114, 115 using one of the corresponding diversion pipes 128, 129, 130.

Now with reference to FIG. 8, the controller 102 may include a comparison circuit 810, which receives as input one or more outputs from sensor 105a, 106a, 107a and compares the input to one or more predetermined threshold values, and generates a valve control instruction based on the comparison. In one embodiment, the valve control instruction may be an electronic single, instruction or unit of data communication configured to be received and interpreted by the valve 104 and including an indication of how the valve 104 should direct the liquid effluent received from the hydrofluoric acid outlet pipe 203 to one of the storage facilities 113, 114, 115 using one of the corresponding diversion pipes 128, 129, 130. For example, if sensor 105a outputs several indications of hydrofluoric acid in hydrofluoric acid outlet pipe 203, then controller 102 may transmit instructions to valve 104 to open a port corresponding to storage facility 113, and ports corresponding to any other storage facility should remain closed.

In one embodiment, the comparison circuit may compare one or more of the sensors 105a, 106a, 107a output to one or more corresponding predetermined threshold values including, but not limited to: the pH output and the resistivity output. Controller 102 may compare output from sensors 105a, 106a, 107a to corresponding threshold values at predetermined time intervals or continually such that monitoring and control of the acid effluent occur in real-time (i.e. without any intended delay).

In some embodiments, controller 102 may be provided in wafer cleaning system 101. In other embodiments, controller 102 may be provided remotely or separately from the wafer cleaning system 101 but may receive data and/or instructions from the wafer cleaning system 101, for example, information on a current or past operational or cleaning state of the wafer cleaning system. In one embodiment, the controller 102 may generate a valve control instruction based on an input from the wafer cleaning system 101 including a current or past operational stage of the wafer cleaning system 101.

Returning to FIG. 2, in one example, if the comparisons performed on one or more of the inputs from sensors 105a, 106a, 107a indicate that the liquid effluent in the hydrofluoric acid outlet pipe 203 is in the predetermined pH range of 1-2 (i.e. extremely acidic), then the controller 102's valve control instruction may indicate that valve 104 should selectively open only the output port connected to diversion pipe 128 and corresponding storage facility 113.

Similarly, if comparisons performed on one or more inputs from sensors 105a, 106a, 107a indicate that the liquid effluent in the hydrofluoric acid outlet pipe 203 is in the predetermined pH range of 2.1 to 5 (moderately acidic), then the valve control instruction may indicate that valve 104 should selectively open only the output port connected to diversion pipe 129 and corresponding storage facility 114.

Similarly, if the comparisons performed on one more of the inputs from sensors 105a, 106a, 107a indicate that the effluent in the hydrofluoric acid outlet pipe 203 is in the predetermined pH range of 5.5-7 pH (i.e. minimally acid), then the valve control instruction may indicate that valve 104 should selectively open only the output port connected to diversion pipe 130 and corresponding storage facility 115.

Separating the liquid effluent, based at least on its pH value allows certain effluent to be reused. For example, effluent with a pH range of 5.5-7 might be useful as gray water, which can be used in cooling towers. In another example, effluent with a pH of 7 might be useful for watering vegetation. In another example, effluent with a pH value of 1-2 might be reusable as hydrofluoric acid.

Controller 102 may generate the valve control instruction based at least in part on: recipe information of wafer cleaning system 101, which indicates the operational state and combination of chemicals used in that operational state; output from sensors 105, 106, 107, 105a, 106a, 107a, which may indicate the flow rate of the effluent, pH levels, resistivity, the presence of: hydrogen fluoride, hydrogen chloride, ammonia, water, ethanol, isopropyl alcohol, carbon, ozone, and any reagent that can result in a liquid emission from wafer cleaning system 101; predetermined thresholds of any above listed measurable characteristics; or in combination of any two or more items listed above.

Although FIG. 2 is illustrated with valve 104, the invention is may consist of any number of valves. In some embodiments, there is a first valve connected to valve input 207, and a second valve connected to valve input 209. The first and second valve may route liquid effluent to foundries 113, 114, 115, using one of the corresponding diversion pipes 128, 129, 130. In another embodiment a first and second valve may not have access to the same foundries. In such an embodiment a first valve will have a first set of foundries and a second valve will have a second set of foundries.

Figure 3:
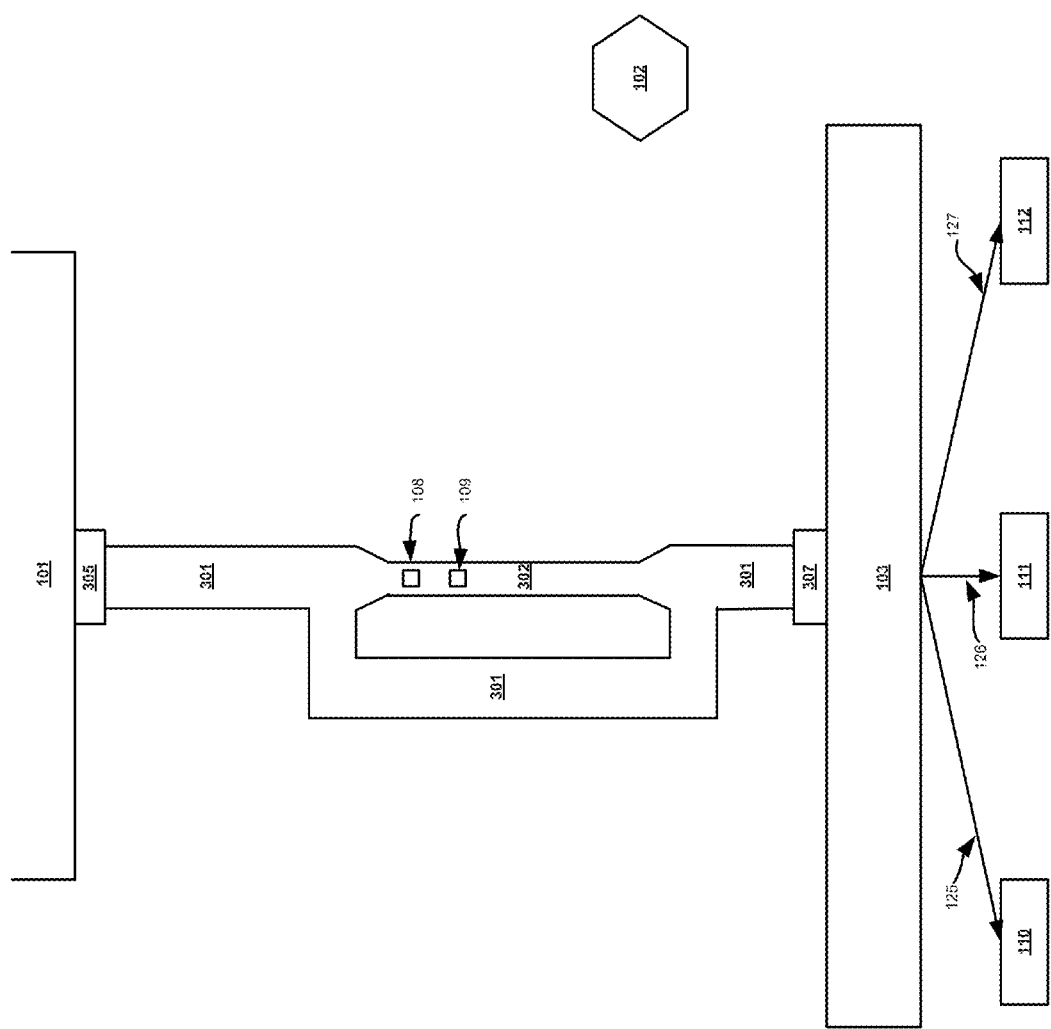
FIG. 3 shows a first exemplary embodiment of a flue gas monitoring system of the resource monitoring system.

FIG. 3 illustrates a more detailed view of an exemplary embodiment of a flue gas monitoring system of the exemplary resource monitoring system 100. Wafer cleaning system 101 may contain flue output port 305, for outputting flue gas from wafer cleaning system 101.

Flue gas output through flue output port 305 is input into flue gas outlet pipe 301. Flue gas outlet pipe 301 feeds into flue gas bypass pipe 302 and further downstream to valve input 307. Flue gas outlet pipe 301 may be dimensioned and configured to accommodate a volume flow rate of the flue gas released. In some embodiments, the flue gas in the flue gas outlet pipe 301 may have a volume flow rate of about 600 cubic feet per minute.

Flue gas outlet pipe 301 may include flue gas bypass pipe 302 that receives a portion of the flue gas flow from the flue gas outlet pipe 301 so that one or more properties of the flue gas may be detected by sensors 108, 109 and returns the flue gas back to the flue gas outlet pipe 301. The flue gas bypass pipe 302 may have an upstream end connected to an upstream portion of the flue gas outlet pipe 301, and a downstream end that is fluid communication with sensors 108, 109. The flue gas bypass pipe 302 may be dimensioned and configured so that the cross-sectional diameter is substantially smaller than the cross-sectional diameter of the flue gas outlet pipe 301 to accommodate a smaller volume flow rate of the flue gas than is present in the flue gas outlet pipe 301. The flue gas bypass pipe 302 enables the pressure of the flue gas to be significantly lower than the pressure of the flue gas in the flue gas outlet pipe 301, which allows the sensors 108, 109 to detect one or more properties of the flue gas without being damaged.

Figure 4:
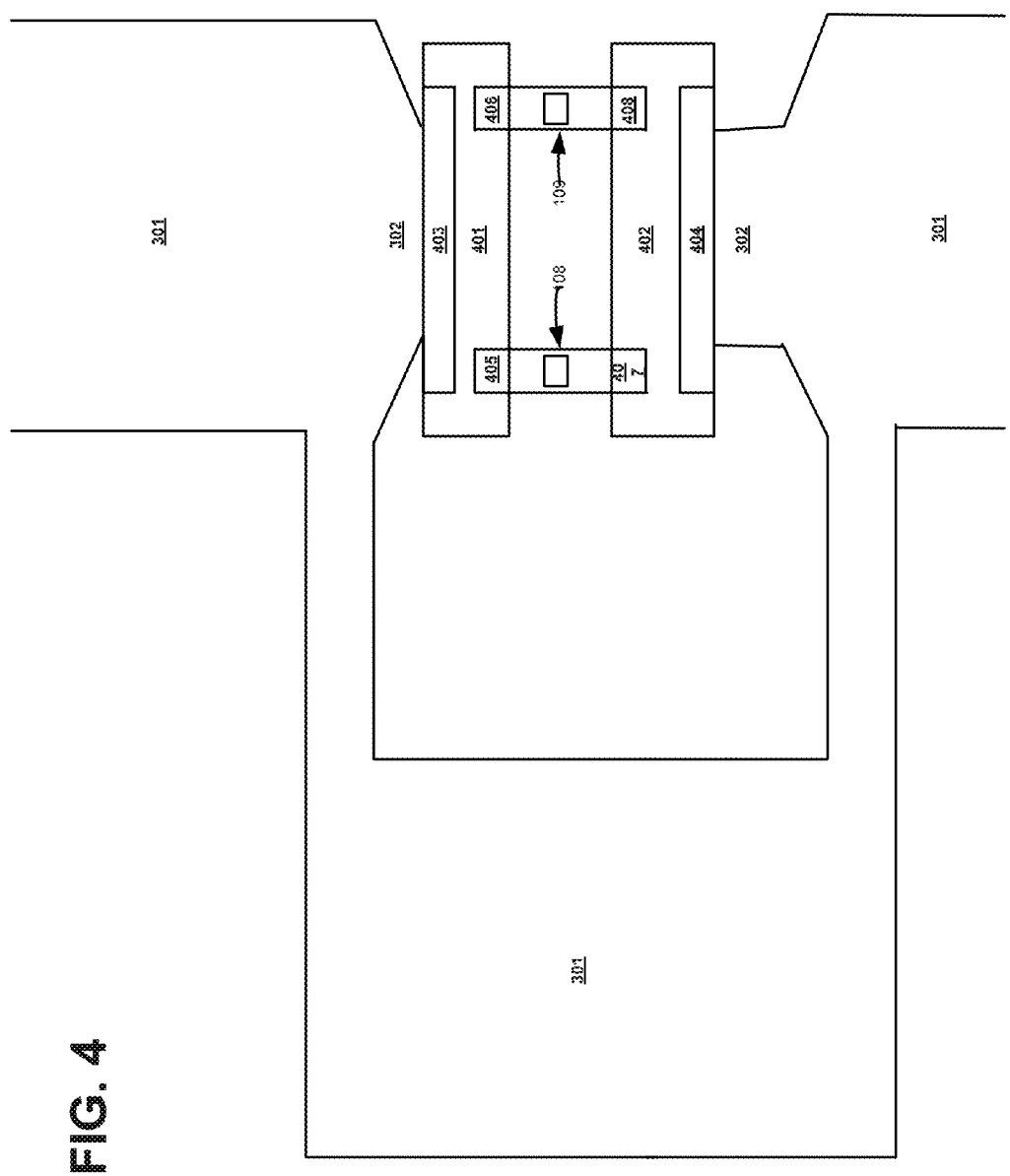
FIG. 4 shows a second exemplary embodiment of a flue gas monitoring system of the resource monitoring system.

FIG. 4 shows a second embodiment of exemplary embodiment of flue gas bypass pipe 302 of the flue gas monitoring system of the resource monitoring system 100. In this particular embodiment, flue gas outlet pipe 301 feeds into the flue gas bypass pipe 302, and the flue gas bypass 302 feeds into the inlet port 403 of flue intake manifold 401. Flue intake manifold 401 is connected to a downstream end of the flue bypass pipe 302, outlet ports 405, 406 are connected sensors 108, 109. The flue intake manifold 401 thereby allows the flue gas to be uniformly distributed to multiple flue sensors for substantially concurrent detection of multiple properties of the flue gas. By routing the flue gas into separate outlet ports 405, 406 the flue intake manifold 401 also relieves each sensor from being exposed to the full pressure of the flue gas in the flue gas bypass pipe 302. This diversion prevents the sensors from being damaged under the potential immense pressure of the flue gas in flue bypass pipe 302.

In some embodiments, the flue gas bypass pipe 302 may include a flue exhaust manifold 402 that includes input ports 407, 408 connected to flue sensors 108, 109, and an outlet port 404 connected to flue gas bypass pipe 302. Flue gas bypass pipe 302 may have a downstream end that is connected to a downstream portion of the flue gas outlet pipe 301 so that the flue gas that was diverted away for sensing is returned to the general flow in the flue gas outlet pipe 301.

Returning to FIG. 3, further downstream from sensors 108, 109 and the flue gas bypass pipe 302, the flue gas outlet pipe 301 may have a downstream end connected to valve input 307. Valve input 307 is connected to valve 103 and valve 103 routes the flue gas to processing modules 110, 111, 112 using one of the corresponding diversion pipes 125, 126, 127. Valve 103 may include a single valve or a bank of multiple valves configured to selectively direct the flue gas in the flue gas outlet pipe 301 into one of the processing modules 110, 111, 112, using one of the corresponding diversion pipes 125, 126, 127.

In one embodiment valve 103 may be operated by controller 102. Controller 102 may be configured to analyze the outputs from sensors 108, 109 and based at least in part of the analysis, signal valve 104 to selectively divert the gas flue in the flue gas outlet pipe 301 to one or more of the processing modules 110, 111, 112 using one of the corresponding diversion pipes 125, 126, 127.

Now with reference to FIG. 8, the controller 102 may include a comparison circuit 810, that receives as input one or more outputs from sensor 108, 109 and compares the input to one or more predetermined threshold values, and that generates a valve control instruction based on the comparison. In one embodiment, the valve control instruction may be an electronic single, instruction or unit of data communication configured to be received and interpreted by the valve 103 and including an indication of how the valve 103 should direct the flue gas received from the flue gas outlet pipe 301 to one of the processing modules 110, 111, 112 using one of the corresponding diversion pipes 125, 126, 127. For example, if sensor 108 outputs several indications of hydrofluoric acid in flue gas outlet pipe 301, then controller 102 may transmit instructions to valve 103 to open a port corresponding to processing module 110, and ports corresponding to any other processing module should remain closed.

In one embodiment, the comparison circuit may compare one or more of the following sensor outputs to one or more corresponding predetermined threshold values: hydrofluoric acid output and hydrochloric acid output. Controller 102 may compare output from sensors 108, 109 to corresponding threshold values at predetermined time intervals or continually such that monitoring and control of the flue gas may occur in real-time (i.e. without any intended delay).

In some embodiments, controller 102 may be provided in the wafer cleaning system 101. In other embodiments, controller 102 may be provided remotely or separately from the wafer cleaning system 101 but may receive data and/or instructions from the wafer cleaning system 101, for example, information on a current or past operational or cleaning state of the wafer cleaning system. In one embodiment, the controller 102 may generate a valve control instruction based on an input from the wafer cleaning system 101 including a current or past operational stage of the wafer cleaning system 101.

Returning to FIG. 3, in one example, if the comparisons performed on one or more of the inputs from sensors 108, 109 indicate that the flue gas in the flue gas outlet pipe 301 is excessively acidic (i.e. more acidic than a predetermined threshold activity), then the valve control instruction may indicate that the valve 103 should selectively open only the output port connect to diversion pipe 125 and corresponding processing module 110.

Similarly, if comparisons performed on one or more inputs from sensors 108, 109 indicate that the flue gas in the flue gas outlet pipe 301 is excessively caustic (i.e. more caustic than a predetermined threshold causticity), then the valve control instruction may indicate that valve 103 should selectively open only the output port connected to diversion pipe 126 and corresponding processing module 111.

Similarly, if comparisons performed on one or more inputs from sensors 108, 109 indicate that the flue gas in the flue gas outlet pipe 301 contains an excessive concentration of one or more solvents (i.e. a higher solvent concentration than a predetermined threshold concentration), then the valve control instruction may indicate that valve 104 should selectively open only the output port connected to diversion pipe 127 and corresponding processing module 112.

Separating the flue gas in flue outlet pipe 301, based at least on acid, caustic, or solvent levels allows proper processing for the flue gas before it will be released into the atmosphere.

Controller 102 may generate the valve control instruction based at least in part on: recipe information of wafer cleaning system 101, which indicates the operational state and combination of chemicals used in that operational state; output from sensors 108, 109 which may indicate the presence of: hydrogen fluoride, hydrogen chloride, ammonia, water, ethanol, isopropyl alcohol, carbon, ozone, any reagent that can result in a gaseous emission from wafer cleaning system 101, and the like; output from sensors 108, 109, which may indicate temperature and gas pressure; predetermined thresholds of any above listed measurable characteristics; or a combination of any two or more items listed above.

With regard to FIG. 2 and FIG. 3 although sensors were only illustrated in the bypass pipes, it should be understood that sensors may be located anywhere in the resource monitoring system, including in the wafer cleaning system, output ports, outlet pipes, and valves.

FIG. 5 illustrates an exemplary user interface 501 of visual display device 116 for displaying outputs from one or more sensors provided in the resource monitoring system 100.

In one embodiment, the user interface 501 may render, in real-time, representations of the sensors 105, 106, 107, 105*a*, 106*a*, 107*a*, 108, 109 outputs over time, for example, graph 502*a* for displaying the hydrogen fluoride output of sensor 105, graph 502*b* for displaying the hydrogen chloride output of sensor 106, graph 502*c* for displaying the temperature output of sensor 107, graph 502*d* for displaying the isopropyl alcohol output of sensor 108, and graph 502*e* for displaying the ozone output of sensor 109. In one embodiment, the user interface 501 may render indications of the instantaneous levels of samples taken by sensors 105, 106, 107, 105*a*, 106*a*, 107*a*, 108, 109 in a bar graph form. In certain embodiments, one or more alarms may be generated if it is determined that one or more of the sensors 105, 106, 107, 105*a*, 106*a*, 107*a*, 108, 109 outputs have exceeded predetermined threshold values. In one example, the alarms may be visually represented on the user interface 501 as alarms 503*a-e* each corresponding to one sensor 105, 106, 107, 105*a*, 106*a*, 107*a*, 108, 109 outputs. In another example, the alarms may be audibly generated alternatively or in addition to the visual alarms.

In other embodiments, graphs 502*a-e* may display any output from any sensor. The settings button 504*a-e* allows a user of visual display device 116 to change the sensor output on each graph, as well as change various other chart properties including but not limited to: graph type (e.g. bar, line, pie, etc.), threshold level for alert notifications, and the time interval of the chart. While FIG. 5 only illustrates some sensor outputs, it is within the scope of the invention to display sensor outputs for any sensor within any embodiment of the invention. For example, in one embodiment, the user interface 501 may render, in real-time, representations of the sensor outputs over time, for example, graph 502*a* for displaying the pH output from sensor 105 and graph 502*b* for displaying the resistivity output from sensor 106. It is also within the scope of the invention to display information pertaining to the leak detector and the micro switches in the resource monitoring system 100. For example an alert may displayed when there is a leak detected in the resource monitoring system or when there has been unauthorized access to the resource monitoring system.

FIG. 6 demonstrates an example of a method using the liquid effluent monitoring system of the resource monitoring system 100. In step 600 a wafer cleaning system outputs liquid effluent as a byproduct of a wafer cleaning process. In step 601, one or more sensors of the liquid effluent monitoring system of the resource monitoring system samples the liquid effluent to determine the presence of certain properties. In step 602, each sample that the one or more sensors take is sent to a controller and a visual display device. In step 603, the controller, based on the received sample from one or more sensors is configured to send a valve control signal to a valve. In step 605, the valve will receive the control signal from the controller and route the liquid effluent to a proper storage facility. Once the effluent is output to a proper storage facility it is capable of being reused with minimal processing. For example, if the effluent has pH value between 5.5 and 8-5 and resistivity of 2-4 mega ohms, then the liquid effluent might be reusable as gray water without any additional processing. In step 604, the user of a visual display device is able to determine the condition of the wafer cleaning system based upon the output of the sensors. For example, if wafer cleaning system is in step one of an RCA clean and that step calls for a mixture of 5 parts water, 1 part ammonium hydroxide, and 1 part hydrogen peroxide, but the liquid effluent reveals an excessive amount of ammonium hydroxide then it is an indicator that something is going wrong in the wafer cleaning system.

FIG. 7 demonstrates an example of a method of using the flue gas monitoring system of the resource monitoring system 100. In step 700 a wafer cleaning system outputs flue gas as a byproduct of a wafer cleaning process. In step 701, one of more sensors of the flue gas monitoring system of the resource monitoring system samples the flue gas to determine the presence of certain properties. In step 702, each sample that the one or more sensors take is sent to a controller and a visual display device. In step 703, the controller, based on the received sample from one or more sensors, is configured to send a valve control signal to a valve. In step 705, the valve will receive the control signal from the controller and route the flue gas to a proper processing module. For example, if the flue gas is detected to have a high concentration of hydrofluoric acid it should be processed differently than if the flue gas has a high concentration of ozone. In step 704, the user of a visual display device is able to determine the condition of the wafer cleaning system based upon the output of the sensors. For example, if wafer cleaning system is in step one of an RCA clean and that step calls for a mixture of 5 parts water, 1 part ammonium hydroxide, and 1 part hydrogen peroxide, but the gas flue reveals an excessive amount of ammonium hydroxide then it is an indicator that something is going wrong in the wafer cleaning system.

FIG. 8 is an illustration of an exemplary embodiment of controller 102. Controller 102 consists of a processor 802 that is connected to memory 804. Memory 804 is configured to store data, controller 102's operating system, information received from any sensors, information received from wafer cleaning system 101, information received from a user of visual display device 116, predetermined threshold values, and other data. Input/output circuitry 806 is configured to receive communications from any sensor, wafer cleaning system 101, and a user of visual display device 116. Comparison circuit 810 is configured to take the communications received from input/out circuitry 806 and information in memory 804 and perform analysis on various data to determine the proper routing of flue gas and liquid effluent output from wafer cleaning system 101. Communications circuitry 808 is configured to send valve control information to any valve.

III. Exemplary Processors and Computing Devices

Systems and methods disclosed herein may include one or more programmable processors, processing units and computing devices having associated therewith executable computer-executable instructions held or encoded on one or more non-transitory computer readable media, RAM, ROM, hard drive, and/or hardware. In exemplary embodiments, the hardware, firmware and/or executable code may be provided, for example, as upgrade module(s) for use in conjunction with existing infrastructure (for example, existing devices/processing units). Hardware may, for example, include components and/or logic circuitry for executing the embodiments taught herein as a computing process.

Displays and/or other feedback means may also be included, for example, for rendering a graphical user interface, according to the present disclosure. The displays and/or other feedback means may be stand-alone equipment or may be included as one or more components/modules of the processing unit(s).

The actual computer-executable code or control hardware that may be used to implement some of the present embodiments is not intended to limit the scope of such embodiments. For example, certain aspects of the embodiments described herein may be implemented in code using any suitable programming language type such as, for example, the MATLAB technical computing language, the LABVIEW graphical programming language, assembly code, C, C# or C++ using, for example, conventional or object-oriented programming techniques. Such computer-executable code may be stored or held on any type of suitable non-transitory computer-readable medium or media, such as, a magnetic or optical storage medium.

As used herein, a "processor," "processing unit," "computer" or "computer system" may be, for example, a wireless or wire line variety of a microcomputer, minicomputer, server, mainframe, laptop, personal data assistant (PDA), wireless e-mail device (for example, "BlackBerry," "Android" or "Apple," trade-designated devices), cellular phone, pager, processor, fax machine, scanner, or any other programmable device configured to transmit and receive data over a network. Computer systems disclosed herein may include memory for storing certain software applications used in obtaining, processing and communicating data. It can be appreciated that such memory may be internal or external to the disclosed embodiments. The memory may also include a non-transitory storage medium for storing computer-executable instructions or code, including a hard disk, an optical disk, floppy disk, ROM (read only memory), RAM (random access memory), PROM (programmable ROM), EEPROM (electrically erasable PROM), flash memory storage devices, or the like.

In describing exemplary embodiments, specific terminology is used for the sake of clarity. For purposes of description, each specific term is intended to; at least, include all technical and functional equivalents that operate in a similar manner to accomplish a similar purpose. In addition, in some instances where a particular exemplary embodiment includes a plurality of system elements or method steps, those elements or steps may be replaced with a single element or step. Likewise, a single element or step may be replaced with a plurality of elements or steps that serve the same purpose. Further, where parameters for various properties are specified herein for exemplary embodiments, those parameters may be adjusted up or down by $\frac{1}{20}$th, $\frac{1}{10}$th, $\frac{1}{5}$th, $\frac{1}{3}$rd, $\frac{1}{2}$nd, and the like, or by rounded-off approximations thereof, unless otherwise specified. Moreover, while exemplary embodiments have been shown and described with references to particular embodiments thereof, those of ordinary skill in the art will understand that various substitutions and alterations in form and details may be made therein without departing from the scope of the invention. Further still, other aspects, functions and advantages are also within the scope of the invention.

Exemplary flowcharts are provided herein for illustrative purposes and are non-limiting examples of methods. One of ordinary skill in the art will recognize that exemplary methods may include more or fewer steps than those illustrated in the exemplary flowcharts, and that the steps in the exemplary flowcharts may be performed in a different order than shown.

Blocks of the block diagram and the flow chart illustrations support combinations of means for performing the specified functions, combinations of steps for performing the specified functions and program instruction means for performing the specified functions. It will also be understood that some or all of the blocks/steps of the circuit diagram and process flowchart, and combinations of the blocks/steps in the circuit diagram and process flowcharts, can be implemented by special purpose hardware-based computer systems that perform the specified functions or steps, or combinations of special purpose hardware and computer instructions. Exemplary systems may include more or fewer modules than those illustrated in the exemplary block diagrams.

Many modifications, combinations and other embodiments of the inventions set forth herein will come to mind to one skilled in the art to which these embodiments of the invention pertain having the benefit of the teachings presented in the foregoing descriptions and the associated drawings. Therefore, it is to be understood that the embodiments of the invention are not to be limited to the specific embodiments disclosed and that modifications, combinations and other embodiments are intended to be included within the scope of the appended claims. Although specific terms are employed herein, they are used in a generic and descriptive sense only and not for purposes of limitation.

What is claimed is:

1. A liquid effluent monitoring system, comprising:
one or more outlet pipes connected to one or more outlet ports of a wafer cleaning system for receiving one or more liquid effluents discharged by the wafer cleaning system;
one or more bypass pipes connected to the one or more outlet pipes, the one or more bypass pipes in communication with one or more sensors, the one or more sensors to generate one or more outputs indicative of characteristics of the one or more liquid effluents;
one or more valves connected to the one or more outlet pipes and to a first, second, and third diversion pipes, the one or more valves positioned to be downstream from the one or more outlet pipes and upstream of the first, second, and third diversion pipes, the one or more valves configured to direct the one or more liquid effluents from the one or more outlet pipes to one of the first, second, or third diversion pipes;
first, second, and third storage facilities connected at a downstream end to each of the first, second, and third diversion pipes, respectively;
a controller, operatively connected to the one or more valves to direct the one or more liquid effluents to the first, second, or third diversion pipes, the controller having as an input: one or more outputs from the one or more sensors, an output from an operational state of the wafer cleaning system, and/or a predetermined chemical mixture output corresponding to a particular operational stage of the wafer cleaning system; wherein the controller, based at least on the one or more inputs, having as an output a valve control instruction that operates the one or more valves to direct the one or more liquid effluents to the first, second, or third diversion pipes;
the one or more outlet ports of the wafer cleaning system comprise an acid outlet port for discharging the liquid effluent and a hydrofluoric acid outlet port for discharging the liquid effluent from the wafer cleaning system;
the one or more outlet pipes comprise a first outlet pipe connected at an upstream end to the first outlet port and a second outlet pipe connected at an upstream end to the second outlet port; and
the one or more bypass pipes comprise a first bypass pipe connected at an upstream end to the first outlet pipe and a second bypass pipe connected at an upstream end to the second outlet pipe, the first bypass pipe in communication with the one or more sensors including a first pH sensor and a first resistivity sensor, the first pH sensor generates a first pH output indicative of a pH of the liquid effluent, the first resistivity sensor generates a first resistivity output indicative of a resistivity of the liquid effluent, the second bypass pipe in fluid communication with the one or more sensors including a second pH sensor, a second resistivity sensor and a hydrogen fluoride sensor, the second pH sensor generates a second pH output indicative of a pH of the liquid effluent, the second resistivity sensor generates a second resistivity output indicative of a resistivity of the liquid effluent, the hydrogen fluoride sensor generates a concentration output indicative of a hydrogen fluoride concentration of the liquid effluent.

2. The liquid effluent monitoring of claim 1, wherein:
the one or more valves comprise a first valve connected to the first outlet pipe and to the first, second and third diversion pipes, and a second valve connected to the second outlet pipe and to the first, second, and third diversion pipes;
the controller is configured to generate a first valve control instruction based on the first pH output and the first resistivity output, the first valve control instruction indicating a first selected one of the first, second, or third diversion pipes, the controller transmits the first control valve instruction to the first valve;
the controller is configured to generate a second valve control instruction based on the second pH output, the second resistivity output and the concentration output, the second valve control instruction indicating a second selected one of the first, second, or third diversion pipes, the controller configured to transmit the second valve control instruction to the second valve;
upon receipt of the first valve control instruction, the first valve diverts the liquid effluent received from the first outlet pipe to the first selected one of the first, second or third diversion pipes; and
upon receipt of the second valve control instruction, the second valve diverts the liquid effluent received from the second outlet pipe to the second selected one of the first, second, or third diversion pipes.

3. The liquid effluent monitoring system of claim 2, wherein the first selected one of the first, second, or third diversion pipes is different from the second selected one of the first, second, or third diversion pipes.

4. The liquid effluent monitoring system of claim 2, wherein the first selected one of the first, second or third diversion pipes is the same as the second selected one of the first, second or third diversion pipes.

5. The liquid effluent monitoring system of claim 1, wherein the controller comprises a comparison circuit, the comparison circuit configured to compare the pH output and the resistivity output to a set of predetermined threshold values, and wherein the controller generates the valve control instruction based on the comparison.

6. The liquid effluent monitoring system of claim 1, wherein each of the one or more bypass pipes has a cross-sectional diameter substantially smaller than cross-sectional diameters of the one or more outlet pipes.

7. The liquid effluent monitoring system of claim 1, wherein the controller is configured to receive an input from the wafer cleaning system indicating an operational stage of the wafer cleaning system, and wherein the controller is configured to generate the valve control instruction based on the input indicating the operational stage of the wafer cleaning system.

8. The liquid effluent monitoring system of claim 1, wherein the controller is provided remotely from the wafer cleaning system.

9. The liquid effluent monitoring system of claim 1, wherein the controller is provided in the wafer cleaning system.

10. The liquid effluent monitoring system of claim 1, wherein the one or more sensors further comprises sensors selected from the group:
- a pH sensor, to generate a pH output indicative of a pH of the one or more liquid effluents;
- a resistivity sensor, to generate a resistivity output indicative of a resistivity of the one or more liquid effluents;
- a hydrogen fluoride sensor, to generate an output indicative of the presence of hydrogen fluoride in the one or more liquid effluents;
- a hydrogen chloride sensor, to generate an output indicative of the presence of hydrogen chloride in the one or more liquid effluents;
- an ammonia sensor, to generate an output indicative of the presence of ammonia in the one or more liquid effluents;
- an isopropyl alcohol sensor, to generate an output indicative of the presence of isopropyl alcoholic in the one or more liquid effluents;
- a temperature sensor, to generate an output indicative of the temperature of the one or more liquid effluents; and
- a flow sensor, to generate an output indicative of the rate of flow of the one or more liquid effluents.

11. The liquid effluent monitoring system of claim 1, wherein characteristics of the one or more liquid effluents is one or more of: a pH of the one or more liquid effluents and a resistivity of the one or more liquid effluents.

12. A liquid and gas effluent monitoring system, comprising:
- a flue outlet pipe connected to a flue outlet port of a wafer cleaning system for receiving a flue gas released by the wafer cleaning system;
- a flue bypass pipe connected to the flue outlet pipe and in communication with one or more flue sensors, the one or more flue sensors configured to generate one or more outputs indicating concentrations of one or more chemical components present in the flue gas;
- a flue valve connected to the flue outlet pipe and to a first, second, and third flue diversion pipes, the flue valve positioned to be downstream from the flue outlet pipe and upstream of the first, second and third flue diversion pipes, the flue valve configured to direct the flue gas from the flue outlet pipe to one of the first, second or third flue diversion pipes;
- first, second, and third exhaust processing modules connected at a downstream end to each of the first, second, and third flue diversion pipes, respectively;
- an acid outlet pipe connected to an acid outlet port of the wafer cleaning system for receiving a liquid effluent discharged by the wafer cleaning system;
- an acid bypass pipe connected to the acid outlet pipe and in fluid communication with a first set one or more liquid effluent sensors, the first set one or more liquid effluent sensors are to generate one or more outputs indicative of characteristics of the liquid effluent;
- an acid valve connected to the acid outlet pipe and to the first, second, and third acid diversion pipes, the acid valve positioned to be downstream from the acid outlet pipe and upstream of the first, second, and third acid diversion pipes, the acid valve configured to direct the liquid effluent from the acid outlet pipe to one of the first, second, or third acid diversion pipes;
- first, second, and third storage facilities connected at a downstream end to each of the first, second, and third acid diversion pipes, respectively;
- a hydrofluoric acid outlet pipe connected to a hydrofluoric acid outlet port of the wafer cleaning system for receiving the liquid effluent discharged by the wafer cleaning system;
- a hydrofluoric acid bypass pipe connected to the hydrofluoric acid outlet pipe and in communication with a second set of one or more liquid effluent sensors, the second set of one or more sensors are configured to generate one or more outputs indicative of characteristics of the liquid effluent;
- an hydrofluoric acid valve connected to the hydrofluoric acid outlet pipe and to a first, second, and third hydrofluoric acid diversion pipes, the hydrofluoric acid valve positioned to be downstream from the hydrofluoric acid outlet pipe and upstream of a first, second, and third hydrofluoric acid diversion pipes, the hydrofluoric acid valve configured to direct the liquid effluent from the hydrofluoric acid outlet pipe to one of the first, second, or third hydrofluoric acid diversion pipes;
- the first, second, and third storage facilities connected at a downstream end to each of the first, second, and third hydrofluoric acid diversion pipes, respectively;
- a controller, operatively connected to the flue, acid, and hydrofluoric acid valves to: direct the flue gas to the first, second, or third flue diversion pipes via a flue valve control instruction, to direct the liquid effluent to the first, second, or third hydrofluoric acid diversion pipes via a hydrofluoric acid valve control instruction, and/or to direct the liquid effluent to the first, second, or third acid diversion pipes via an acid valve control instruction; and
- wherein the controller, having as an input: one or more outputs from the one or more flue sensors, the first set of liquid effluent sensors, the second set of liquid effluent sensors, an output from an operational stage of the wafer cleaning system, and/or a predetermined chemical mixture output corresponding to a particular operational stage of the wafer cleaning system, wherein the controller, based at least on the one or more inputs, having as an output: the flue valve control instruction, the acid valve control instruction, and/or the hydrofluoric acid valve control instruction.

13. The liquid and gas effluent monitoring system of claim 12, wherein the controller receives an input from the wafer cleaning system indicating an operational stage of the wafer cleaning system, and wherein the controller is configured to generate at least one of: the flue valve control instruction, the acid valve control instruction, or the hydrofluoric acid valve control instruction based on the input indicating the operational stage of the wafer cleaning system.

14. The liquid and gas effluent monitoring system of claim 12, wherein the controller is provided remotely from the wafer cleaning system.

15. The liquid and gas effluent monitoring system of claim 12, wherein the controller is provided in the wafer cleaning system.

16. The liquid and gas effluent monitoring system of claim 12, wherein:

the first processing module is a caustic exhaust processing module;

the second processing module is an acid exhaust processing module;

the third processing module is a solvent exhaust processing module.

17. The liquid and gas effluent monitoring system of claim 12, wherein the flue bypass pipe has a cross-sectional diameter substantially smaller than a cross-sectional diameter of the flue outlet pipe.

18. The liquid and gas effluent monitoring system of claim 12, further comprising:
   a flue intake manifold including an inlet port connected to the flue bypass pipe and one or more outlet ports connected to the one or more flue sensors; and
   a flue exhaust manifold including one or more inlet ports connected to the one or more flue sensors and an outlet port connected to the flue return pipe; and
   wherein the one or more flue sensors are positioned to be downstream of the flue intake manifold and the flue exhaust manifold is positioned to be downstream of the one or more flue sensors.

19. The liquid and gas effluent monitoring system of claim 12, wherein the flue gas has a flow rate in a range of 150-200 cubic feet per minute in the flue outlet pipe.

20. The liquid and gas effluent monitoring system of claim 12, wherein the controller comprises a comparison circuit, the comparison circuit configured to compare the one or more outputs from the one or more flue sensors to a set of predetermined threshold values, the controller generating the flue valve control instruction based on the comparison.

21. The liquid and gas effluent monitoring system of claim 12, wherein the characteristics of the liquid effluent comprises: a pH of the liquid effluent and a resistivity of the liquid effluent;
   wherein the controller comprises a comparison circuit, the comparison circuit configured to compare the detected pH of the liquid effluent and the detected resistivity of the liquid effluent to a set of predetermined threshold values, the controller generating the acid valve control instruction and/or hydrofluoric acid valve control instructions based on the comparison.

22. The liquid and gas effluent monitoring system of claim 12, wherein the one or more flue sensors comprises sensors selected from the group consisting of one or more:
   a hydrogen fluoride sensor, to generate an output indicative of the presence of hydrogen fluoride in the flue gas;
   a hydrogen chloride sensor, to generate an output indicative of the presence of hydrogen chloride in the flue gas;
   an ammonia sensor, to generate an output indicative of the presence of ammonia in the flue gas;
   a carbon sensor, to generate an output indicative of the presence of carbon in the flue gas;
   a temperature sensor, to generate an output indicative of the temperature of the flue gas;
   a pressure sensor, to generate an output indicative of the pressure of the flue gas;
   an isopropyl alcohol sensor, to generate an output indicative of the presence of isopropyl alcohol in the flue gas; and
   an ozone sensor, to generate an output indicative of the presence of ozone in the flue gas.

23. The liquid and gas effluent monitoring system of claim 12, wherein the one or more sensors further comprises sensors selected from the group consisting of one or more:
   a pH sensor, to generate a pH output indicative of a pH of the liquid effluent;
   a resistivity sensor, to generate a resistivity output indicative of a resistivity of the liquid effluent;
   a hydrogen fluoride sensor, to generate an output indicative of the presence of hydrogen fluoride in the liquid effluent;
   a hydrogen chloride sensor, to generate an output indicative of the presence of hydrogen chloride in the liquid effluent;
   an ammonia sensor, to generate an output indicative of the presence of ammonia in the liquid effluent;
   an isopropyl alcohol sensor, to generate an output indicative of the presence of isopropyl alcoholic in the liquid effluent;
   a temperature sensor, to generate an output indicative of the temperature of the liquid effluent; and
   a flow sensor, to generate an output indicative of the rate of flow of the liquid effluent.

24. The liquid and gas effluent system of claim 12, wherein the chemical components comprise one or more of: hydrogen fluoride, hydrogen chloride, ammonia, isopropyl alcohol, carbon, ozone, or any reagent that can result in a gaseous emission from the wafer cleaning system.

* * * * *